United States Patent [19]

Stekelenburg et al.

[11] Patent Number: 5,517,244
[45] Date of Patent: May 14, 1996

[54] CHARGE-COUPLED IMAGING DEVICE CAMERA PROVIDED WITH SUCH AN IMAGING DEVICE

[75] Inventors: Michael A. W. Stekelenburg; Hermanus L. Peek, both of Eindhoven, Netherlands; Colm J. Sweeney, Santa Clara, Calif.; Alouisius W. M. Korthout, Eindhoven, Netherlands

[73] Assignee: U.S. Philips Corporation, New York, N.Y.

[21] Appl. No.: 313,662

[22] Filed: Sep. 27, 1994

Related U.S. Application Data

[63] Continuation of Ser. No. 218,993, Mar. 28, 1994, abandoned, which is a continuation of Ser. No. 911,817, Jul. 10, 1992, abandoned.

[30] Foreign Application Priority Data

Jul. 15, 1991 [EP] European Pat. Off. .............. 91201849

[51] Int. Cl.$^6$ .................................................. H04N 5/335
[52] U.S. Cl. ........................... 348/305; 348/317; 348/322
[58] Field of Search ...................................... 348/241, 297, 348/298, 302, 305, 317; H04N 5/335

[56] References Cited

U.S. PATENT DOCUMENTS 3,911,467 10/1975 Levine ......................... 357/24
4,447,735 5/1984 Horii ............................ 250/578
4,635,122 1/1987 Kato et al. ................... 358/213
4,758,895 7/1988 Elabd ........................ 358/213.26

OTHER PUBLICATIONS

"Interlacing in Charge–Coupled Imaging Devices" Sequin, IEEE Transactions on Electron Devices, vol. ED–20, No. 6, Jun. 1973 pp. 535–541.

Primary Examiner—Michael T. Razavi
Assistant Examiner—Ngoc-Yen Vu
Attorney, Agent, or Firm—Steven R. Biren

[57] ABSTRACT

A 3-phase charge-coupled imaging device is operated in the interlace mode. During integration, voltages are applied to the clock electrodes such that charge is integrated below the same set of electrodes each time. The signal charges of the first field are formed in that ¾ portion of the charge in each picture element is augmented by ¼ portion of the charge of the preceding picture element, while the signal charges of the second field are formed in that the ¾ portion is augmented by ¼ portion of the charge generated in the following picture element. These summations may be carried out in the sensor itself in that the charge packages are shifted to the left and right during integration. The flicker which is usually the result of interlacing is very strongly reduced in this way.

6 Claims, 3 Drawing Sheets

CHARGE-COUPLED IMAGING DEVICE CAMERA PROVIDED WITH SUCH AN IMAGING DEVICE

BACKGROUND OF THE INVENTION

This is a continuation of application Ser. No. 08/218,993 filed Mar. 28, 1994, which is a continuation of parent application Ser. No. 911,817, filed Jul. 10, 1992, both now abandoned.

BACKGROUND OF THE INVENTION

The invention relates to a charge-coupled imaging device having a 3-phase charge-coupled device comprising a row of clock electrodes situated above a charge transport channel defined in a semiconductor body, clock voltage means being present for applying clock voltages to the clock electrodes. The invention also relates to a camera provided with such an imaging device. Although the invention will be described below in particular with reference to two-dimensional imaging devices, also called image sensors, it should be borne in mind that the invention may also be advantageously applied to one-dimensional imaging devices or line sensors.

A device of the kind described above is known inter alia from the publication "Interlacing in Charge-Coupled Imaging Devices" by C. H. Séquin, published in IEEE Transactions On Electron Devices, vol. ED-20, No. 6, June 1973, pp. 535–541. This describes a device which is operated in the so-called interlace mode whereby such clock voltages are applied to the clock electrodes that in two consecutive integration periods rasters of picture elements are defined which are shifted relative to one another over a distance of half a pitch between the picture elements (interlacing).

The principle of forming two consecutive rasters which are mutually shifted, often called "interlacing" in the literature, corresponds to the known manner in which a TV picture screen is scanned in two consecutive half rasters. In general, interlacing is obtained in charge-coupled image sensors by means of the applied clock voltages which determine the potential profile in the charge transport channel, and thus the positions of the consecutive picture elements. It is possible to shift the (centers of gravity of the) picture elements over half a pitch, or at least over substantially this distance, in that the voltages are changed during the second integration period compared with the voltages which were applied during the first integration period. This method has the advantage that the number of lines is fictitiously doubled without an accompanying requirement to double the chip surface area used.

In general, the size of the picture elements, also called pixels, is determined by the number of phases by which the device is operated. A frequently used embodiment comprises a 4-phase charge-coupled device in which one picture element corresponds to four clock electrodes. During operation, for example, a blocking voltage is applied to one of these four electrodes, so that a potential barrier against information-bearing charge carriers is induced in the subjacent portion of the charge transport channel. Voltages of the active level are provided to the other three electrodes, a potential well being formed in the channel, in which well a generated charge is stored. The boundaries between the consecutive pixels are situated at least substantially in the centers of the potential barriers. Interlacing may be obtained simply in that the pattern of voltages applied for the first raster is shifted over a distance of half a pixel, i.e. two electrodes, for the second raster.

Besides 4-phase CCDs, 3-phase CCDs are also generally known for various applications. Compared with 4-phase CCDs they have the advantage that only three clock electrodes instead of four are necessary for each charge package. When used in an imaging device this results in a much smaller chip surface area and/or a better resolution. A problem with 3-phase CCDs in imaging devices, however, occurs when the device must be capable of operation in the interlace mode, since it is not possible with a pixel size of three electrodes to shift the pattern of applied voltages over a distance of half a pixel in the simple manner described above.

The publication by Séquin cited above describes a 3-phase CCD in which the first raster is integrated below the electrodes of phase 1 only, while the electrodes of phases 2 and 3 are at the blocking voltage level. For the second raster the situation is reversed, the electrodes of phases 2 and 3 being integrating whereas the electrodes of phase 1 are blocking. It can be easily ascertained that the centers (of gravity) of the pixels of the two rasters are at a distance of approximately 1.5 electrodes, i.e. half a pixel, as is required for interlacing. A disadvantage of this known interlacing is that the conditions under which the two rasters are formed are so substantially different that the transition from the one raster to the other raster, all other conditions being equal, is visible in the display of the image (flicker). This additional noise is particularly unpleasant in versions with vertical anti-blooming, in which the substrate, which is separated from the charge transport channel by a thin layer of the opposite conductivity type to the substrate, which layer is fully depleted during operation, forms the drain zone for an excess of charge carders in the case of overexposure. Such a device is described in, for example, U.S. Pat. No. 4,654,682. Since only one electrode is in the blocking state in the one raster, whereas the other raster has two blocking electrodes, first of all the sensitivity will change, not exclusively but certainly particularly in the versions having vertical anti-blooming as described above in which a relatively greater portion of the charge generated below the blocking electrodes will be drained off to the substrate in the case of two blocking electrodes than in the case of one blocking electrode. For the same reason, the dark currents will also be different in the two rasters.

SUMMARY OF THE INVENTION

The invention has for its object to provide a 3-phase imaging device in which this additional noise as a result of interlacing does not or at least substantially not occur.

According to the invention, a charge-coupled imaging device of the kind mentioned in the opening paragraph is characterized in that equal voltages are applied to the clock electrodes during the two integration periods at least during the major portion of their duration, and in that a raster of charge packages containing information is formed by summation of at least approximately ¾ portion of the charge which is generated in one of the integration periods in a picture element i (i=1, 2, 3, etc.) and ¼ portion of the charge which is generated in the picture element (i−1), and in that the second raster is formed by summation of ¾ portion of the charge which is generated in a picture element i in the other integration period and ¼ portion of the charge generated in the picture element (i+1). An equal number of electrodes can be set for an integrating voltage level and a blocking voltage level during consecutive integration periods, while at the same time the rasters are effectively shifted mutually over a distance of 1.5 clock electrode.

In an embodiment which can be advantageously utilized, identical voltages are supplied to the clock electrodes in consecutive integration periods and the rasters are formed after each integration period through redistribution of the charge packages generated during the integration. An alternative embodiment, which has the advantage that no additional means for redistribution of the charge packages are required, is characterized in that for the purpose of the summations charge packages formed by integration of generated charge for at least approximately ¾ portion of the duration of an integration period in a certain picture element are moved for the remaining ¼ portion of the integration period to the preceding picture element to obtain the first raster, or to the following picture element to obtain the second raster.

The invention may be advantageously used in line sensors or linear imaging devices with which a linear radiation pattern can be detected. A special embodiment of an imaging device according to the invention is characterized in that the charge-coupled device forms part of a two-dimensional image sensor of the frame transfer type (FT sensor) with a pattern of picture elements arranged in rows and columns forming an image sensing section, and with a corresponding pattern of memory elements forming a memory section in which the raster of charge packages formed during the first integration period can be stored, while at the same time in the image sensing section the second raster of charge packages belonging to the second integration period is being formed.

In a simple embodiment, charge integration may be effected in that the integration period T is divided into two consecutive sub-periods having the values ¾T and ¼T. In this case, for example, the charge pattern may be shifted over a distance of one line up or down, depending on the raster, for the remainder of the integration period after ⅔ portion of the integration period has elapsed.

A further embodiment is characterized in that adjacent the memory section a readout register is situated with which the raster of charge packages stored in the memory section is read out line by line during a time called line time hereinafter, while at the same time charge packages of the following raster are formed in the image sensing section by storing these packages alternately during three line times in a picture element corresponding to each package and subsequently during one line time in the preceding or the following picture element in the same column, depending on the raster. This embodiment has the advantage inter alia that the length of the integration period can be increased or decreased, for example in dependence on the light intensity, by draining off the charge generated during a certain time interval and collecting only the charge generated after that, without consequences arising for the method of interlacing proposed here. A preferred embodiment, which has the advantage that the clock voltages do not lead to unfavourable crosstalk on the output signals at the output of the device during the integration period, is characterized in that the transport of charge packages between the corresponding picture element and the preceding or following picture element always takes place between two line times.

BRIEF DESCRIPTION OF THE DRAWING

The invention will be explained in more detail with reference to an embodiment and the accompanying diagrammatic drawing, in which.

DESCRIPTION OF THE PREFERRED EMBODIMENTS

Figure 1:
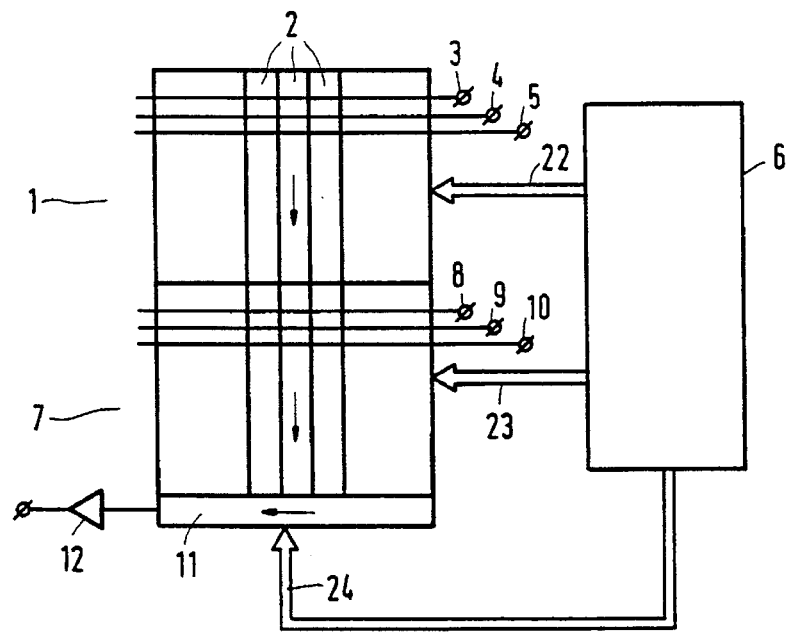
FIG. 1 is a diagram of a charge-coupled imaging device according to the invention.

The invention will be explained with reference to a two-dimensional image sensor below, but it will be obvious without further explanation that the invention may also be advantageously applied to other types of sensors, for example to one-dimensional or line sensors. The device shown diagrammatically in FIG. 1 comprises a system 1 of CCD channels 2 situated next to one another on which an image can be projected, which is converted into a corresponding pattern of charge packages in the CCD channels 2. The drawing shows only 3 CCD channels 2, but in actual fact the number will be much higher and may be, for example, a few hundred. The charge-coupled devices are formed by 3-phase devices in which three clock electrodes correspond to each charge package, and thus to each picture element or pixel. FIG. 1 shows only one group of three electrodes, i.e. the electrodes 3, 4 and 5, but in actual fact the entire surface of the flat system 1 is obviously occupied by electrodes.

The device drawn in FIG. 1 is of the raster transfer or frame transfer type, by way of example, and comprises in addition to the image sensing section 1 a memory section 7 which lies in the extended direction of the sensing section 1 and is screened against incident radiation. The memory section 7 is also formed by a system of 3-phase CCDs, the drawing showing a group of three electrodes 8–10. A horizontal readout register 11, through which the charge packages are transported to an output amplifier 12 in order to be read out one by one, is provided at a side of the memory section situated opposite to the image sensing section for readout purposes, as is usual.

Figure 2:
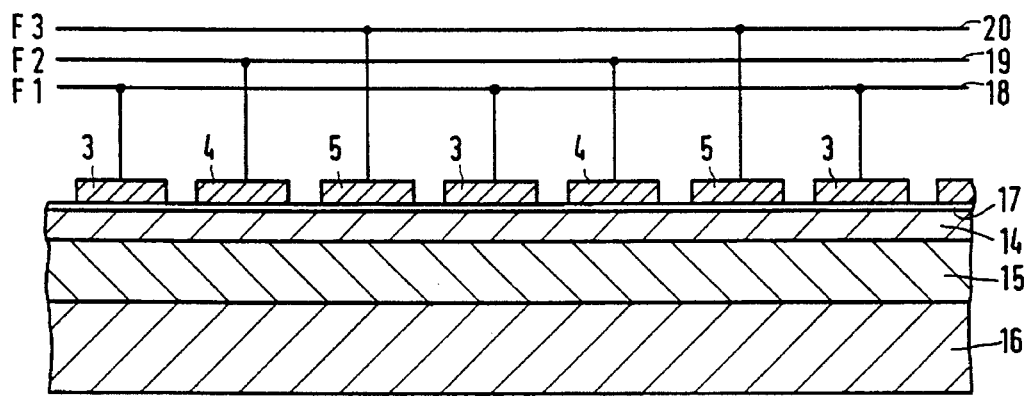
FIG. 2 is a cross-section of the charge-coupled device.

FIG. 2 is a longitudinal section of a portion of one of the CCD channels 2. The device is of the buried channel type with n-type conductivity, comprising an n-type surface layer 14 in which the charge transport and charge storage take place. The layer 14 merges into an adjoining thin p-type layer 15 through a pn-junction, the layer 15 in its turn merging into an n-type substrate 16. As is described inter alia in the U.S. Pat. No. 4,654,682 cited above, an excess of generated electrons in the case of overexposure can be discharged by means of this construction. The surface of the semiconductor body is coated with a thin gate dielectric 17 of, for example, silicon oxide or some other suitable material or combination of materials. The clock electrodes are provided on the layer 17 in the form of conductor tracks of, for example, polycrystalline silicon. The electrodes 3, 4 and 5 are connected to clock lines 18, 19, 20. The clock voltages $F_1$, $F_2$ and $F_3$ are applied to the electrodes 3, 4, 5, respectively, through these clock lines.

The clock voltages are supplied by clock voltage source 6 which generates the said clocks $F_i$ for operating the image sensing section 1, as is symbolically indicated by arrow 22 in FIG. 1. The source 6 also supplies the 3-phase clocks to the electrodes 8, 9 and 10 for operating the memory section 7, indicated by arrow 23, and the clocks for the clock electrodes of the output register 11 and the reset clocks for the output of the register 11, symbolically indicated by the arrow 24.

The clock voltages $F_i$ supplied to the image sensing section during consecutive integration periods differ from one another in the present embodiment in such a way that during the integration periods two rasters of picture elements or pixels are defined which are mutually shifted over a distance of half a pixel pitch, or at least substantially over this distance. This manner of operation is often called "interlacing" in the literature. According to the invention, equal voltages are applied to the clock electrodes during two consecutive integration periods at least during the major portion of these integration periods. The different rasters are obtained in the following way: a raster of charge packages containing information is formed through summation of at least substantially ¾ portion of the charge generated in the first integration period in a picture element i (i=1, 2, 3, etc.) and ¼ portion of the charge generated during this period in the picture element (i−1). The other raster is formed by summation of ¾ portion of the charge generated in a picture element i (i=1, 2, 3, etc.) in the second integration period and ¼ portion of the charge generated in the picture element (i+1) during this period. Although it is advantageously possible to apply constant voltages to the electrodes during the integration and to carry out the summations afterwards by redistribution of the charge packages, in the present embodiment the summations are carried out in the image sensing section itself during the integration periods. For this purpose, charge packages formed by integration of charge during at least approximately ¾ portion of the duration of an integration period in a given picture element are moved for the remaining ¼ portion of the integration period to the preceding picture element to obtain the first raster, or to the following picture element to obtain the second raster. The shifts of the charge packages take place preferably during the line flyback time to prevent crosstalk on the output signals as much as possible.

Figure 3:
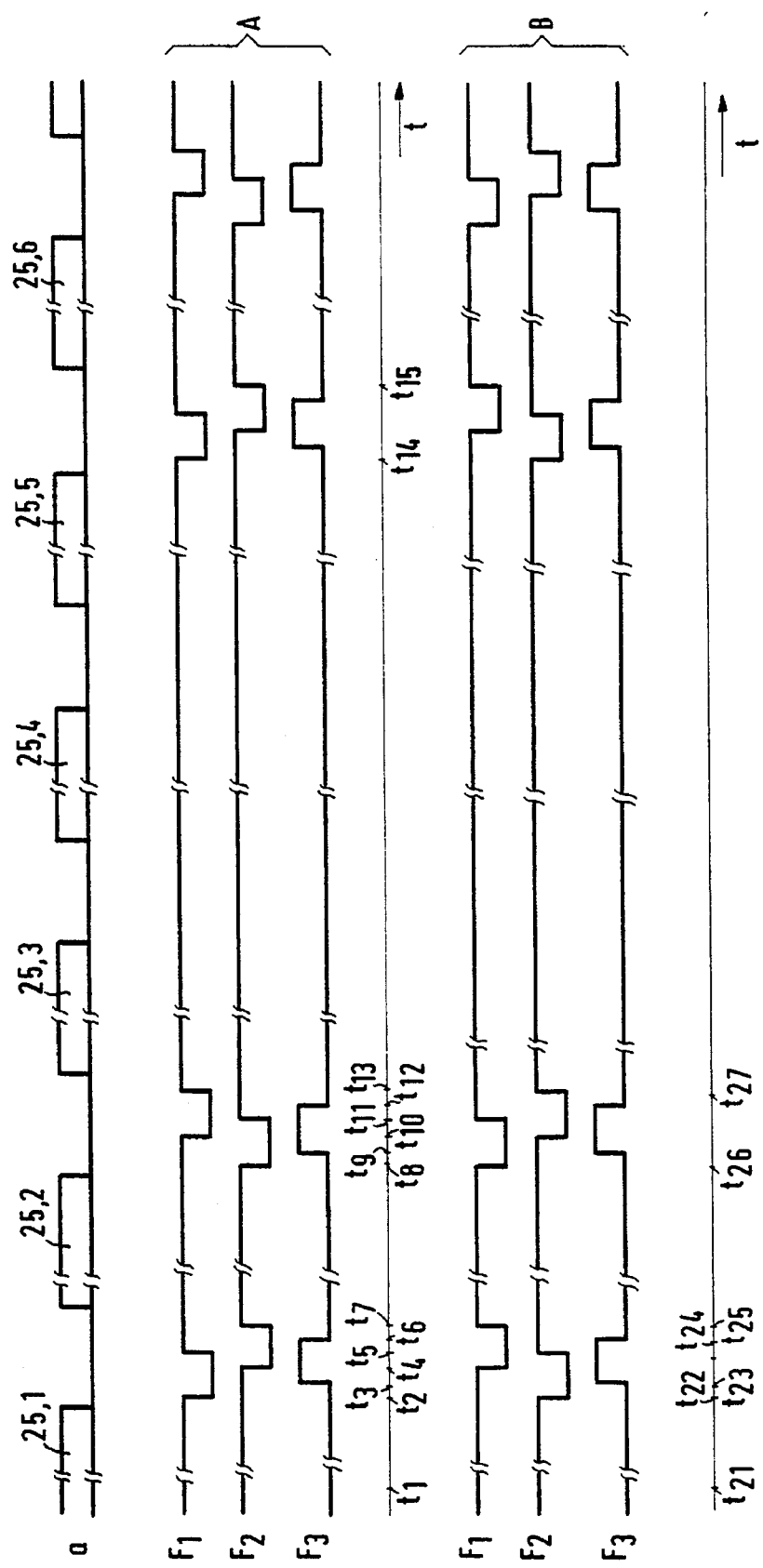
FIG. 3 is a diagram of applied clock voltages as a function of time.
Figure 4:
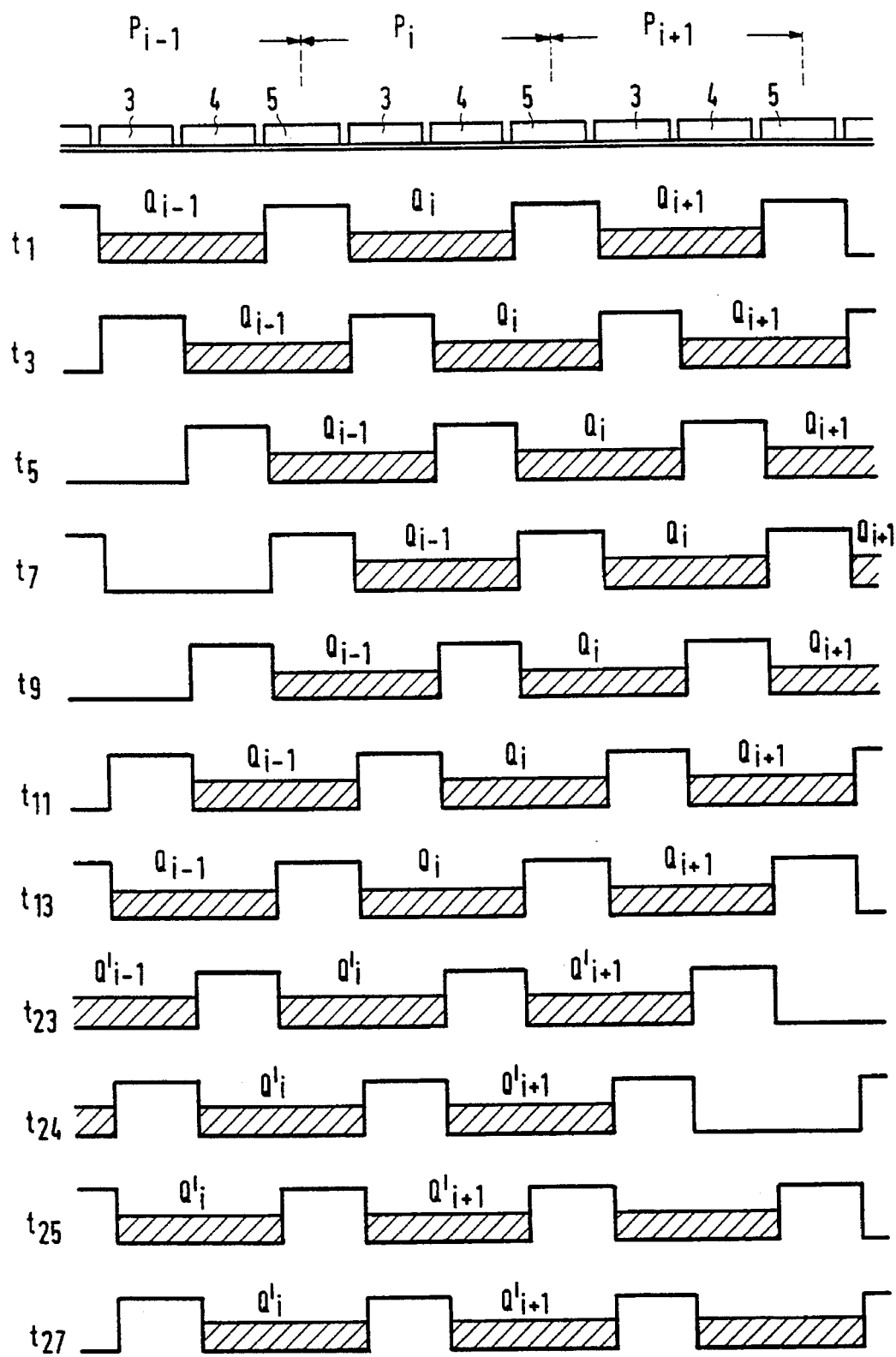
FIG. 4 shows potential profiles which occur at various moments in the charge-coupled device at the clock voltages drawn in FIG. 3.

To clarify the operation of the device, FIG. 3 shows a time diagram of the clock voltages $F_1$, $F_2$ and $F_3$ in two consecutive integration periods designated A and B, while diagram a represents the time axis on which the line times (for example 64 μsec) are indicated by the block 25. FIG. 4 shows accompanying potential distributions in a CCD channel for a number of moments. Broken lines in FIG. 4, furthermore, indicate the boundaries of the picture elements or pixels $P_{i-1}$, $P_i$, $P_{i+1}$. The hatched areas in the potential wells represent the charge packages $Q_{i-1}$, $Q_i$, $Q_{i+1}$. As is evident from the diagrams A and B, the clocks $F_1$, $F_2$ are at the high voltage level for the major part of the integration period, while $F_3$ is low, which means for an n-channel CCD that the electrodes 3 and 4 induce a potential well in the channel in which charge is stored, whereas potential barriers are formed below the electrodes 5, which barriers separate the charge packages from one another. This situation arises, for example, at moment $t_1$, see FIGS. 3 and 4. It is noted that the boundaries between the pixels are assumed to lie below the centers of the electrode 5. After the line time 25, 1, the voltage $F_1$ switches to the low level ($t_2$), after which $F_3$ goes to the high level at $t_3$. The charge packages Q have then been transported to the right over a distance of one electrode, as can be seen in FIG. 4. $F_2$ becomes low at $t_4$, and high again at $t_7$. The charge packages Q have then again been transported one electrode further to the right (see FIG. 4). At $t_6$ and $t_7$, $F_1$ and $F_3$ go to the high and the low level, respectively, so that the charge packages again are moved to the fight over the distance of one electrode length (see FIG. 4, $t_7$). Compared with the situation at $t_1$, the charge packages Q have been transported to the right over a distance of one picture element, so that, for example, the packages $Q_{i-1}$ and $Q_i$ are stored in the picture elements $P_i$ and $P_{i+1}$, respectively. The charge packages Q do not change their position during the line time 25,2, so that the charge generated in any picture element $P_i$ during this line time is added to the charge package $Q_{i-1}$ belonging to the preceding pixel. After one line time, so after line time 25,2, the charge packages $Q_i$ are transported again to their original positions or picture elements $P_i$ in that $F_2$ is brought to the low level first at $t_8$ and then to the high voltage level at $t_9$. The charge packages have then been transported again to the left over a distance of one electrode (see FIG. 4). $F_1$ becomes low and $F_2$ becomes high at $t_{10}$ and $t_{11}$, respectively, so that the situation shown in FIG. 4 for $t_{11}$ is obtained. Then, at $t_{12}$ and $t_{13}$, $F_3$ becomes low and $F_1$ becomes high, so that the charge packages $Q_i$ are again stored in their original picture elements $P_i$. During the line times 25,3, 25,4 and 25,5, the charge packages do not change their positions, so that the charge generated in any picture element $P_i$ during these three line times is added to the relevant charge package $Q_i$. After line time 25,5 has elapsed, the procedure is repeated and the charge packages $Q_i$ are again shifted towards the picture elements $P_{i+1}$ in the interval $t_{14}$–$t_{15}$ and stored there during a line time 25,6. In the line flyback time following the line time 25,6, the charge packages $Q_i$ are again returned to the picture elements $P_i$ and stored there for three line times. This procedure is repeated throughout the integration period. After the integration period, the entire raster of charge packages is transported into the memory section. During readout of this raster, the following raster is formed in the image sensing section, for which purpose the clock voltages F of group B in FIG. 3 are applied. These voltages are such that the same voltages are applied as during the first integration period, except for the transport clocks in the shifting of the charges to the left and right. During the line times 25 of the integration time, $F_1$ and $F_2$ are high and $F_3$ is low, so that a potential profile is obtained in the CCD channel as drawn in FIG. 4 for the moments $t_1$ and $t_{13}$. $F_2$ becomes low at $t_{22}$ before the clock voltage $F_3$ becomes high at $t_{23}$. The charge packages Q' are then shifted one position to the left, as can be seen in FIG. 4. Then $F_1$ becomes low first, after which $F_2$ becomes high at $t_{24}$. The charge packages Q have then been shifted one position further to the left again (see FIG. 4, $t_{24}$). At $t_{25}$, when $F_1$ and $F_2$ are high and $F_3$ is low, the pattern of charge packages as shown in FIG. 4 has been transported to the left over a distance of one picture element, so that a charge package $Q_i$ is stored in the picture element $P_{i-1}$. During one line time the charge generated in this picture element is integrated with the charge package $Q_i$. After this line time the charge packages are again returned to their original picture element ($t_{26}$–$t_{27}$) and stored there for three line times while being augmented by the charge generated in situ. This procedure is repeated throughout the integration period, so that a raster of charge packages $Q_i$ is formed at the end of the integration period comprising ¾ portion of the charge generated in the picture element $P_i$ and ¼ portion of the charge generated in the picture element $P_{i-1}$.

If we consider still pictures, the picture conversion may be seen as a sampling of the scene. For example, the following then holds for the second raster:

$$y(n) = \tfrac{3}{4}x(n) + \tfrac{1}{4}x(n-1)$$

in which x(n) is the illumination of line n and y(n) is the output signal of the image sensor. Transformed to the frequency domain, this becomes:

$$Y(\omega) = \tfrac{3}{4} X(\omega) + \tfrac{1}{4} X(\omega) \exp.(j\omega)$$

in which T is the pitch of the picture elements. The following then holds for the transfer function H:

$$H(\omega) = \tfrac{3}{4} + \tfrac{1}{4} \exp.(-j\omega T)$$

In an analogous manner, it can be derived that for the transfer function in the first raster:

$$H(\omega) = \tfrac{3}{4} + \tfrac{1}{4} \exp.(j\omega T)$$

The amplitude characteristic is in both cases:

$$A(\omega) = \sqrt{(\tfrac{5}{8} + \tfrac{3}{8} \cos \omega T)}$$

The phase difference between the two rasters is:

$$\Delta\phi(\omega) = 2 \operatorname{arctg}[(\tfrac{1}{4} \sin \omega T)/(\tfrac{3}{4} + \tfrac{1}{4} \cos \omega T)]$$

The delay or shift is:

$$\tau_d = d\Delta\phi(\omega)/d\omega = T/2 (2 + 6\cos \omega T)/(5 + 3\cos \omega T).$$

The last equation shows that within the relevant frequency range (between $\omega=0$ and $\omega t=0.5$) the shift, which is T/2 in the ideal case, deviates from T/2 at somewhat higher frequencies. This deviation is usually not unpleasant, very slight, and often not even visible. An important advantage, however, is that the so-called line flicker, which often occurs as a result of interlacing, is reduced in the display.

It will be apparent that the invention is not limited to the embodiment given here, but that many more variations are possible within the scope of the invention to those skilled in the art. Instead of the summation of charges during the integration through shifting of charge packages in two directions, the charge packages $Q_1$ may be stored in the corresponding picture elements $P_i$ during the entire integration period, the output signals being formed after an integration period has elapsed in that the charges are redistributed outside the imaging matrix.

The invention as described for a two-dimensional sensor may also be advantageously applied in a one-dimensional sensor or line sensor.

We claim:

1. A 3-phase-coupled imaging device comprising a row of clock electrodes situated above a charge transport channel defined in a semiconductor body, clock voltage means for applying clock voltages to the clock electrodes, said clock voltage means applying equal voltages to the clock electrodes during two integration periods during at least the major portion of their duration, means for forming a first raster of charge packages containing information by summation of at least a ¾ portion of the charge which is generated in one of the integration periods in a picture element i and at most a ¼ portion of the charge which is generated in the preceding picture element (i−1), and means for forming a second raster by summation of at least a ¾ portion of the charge which is generated in a picture element i in the other integration period and at most a ¼ portion of the charge generated in the following picture element (i+1), said picture elements (i−1), i and (i+1) all being originated within said charge transport channel, to achieve vertical interlacing with interlace lines at equal distances, and wherein potential barriers which separate the charge packages from one another are formed below a third electrode.

2. A charge-coupled imaging device as claimed in claim 1, characterized in that, for the purpose of the summations, charge packages formed by integration of generated charge for at least the ¾ portion of the duration of an integration period in a picture element are moved for the remaining at most ¼ portion of the integration period to one of the preceding picture element to obtain the first raster and the following picture element to obtain the second raster.

3. A charge-coupled imaging device as claimed in claim 2, characterized in that the charge-coupled device forms part of a two-dimensional image sensor of the frame transfer type (FT sensor) with a pattern of picture elements arranged in rows and columns forming an image sensing section, and with a corresponding pattern of memory elements forming a memory section in which the first raster of charge packages formed during the first integration period can be stored, while at the same time in the image sensing section the second raster of charge packages belonging to the second integration period is being formed.

4. A charge-coupled imaging device as claimed in claim 3, characterized in that adjacent the memory section a readout register is situated with which a particular raster of charge packages stored in the memory section is read out line by line during a line time, while at the same time charge packages of a following raster are formed in the image sensing section by storing these packages alternately during three line times in a picture element corresponding to each package and subsequently during one line time in one of a preceding and a following picture element in the same column, depending on the raster.

5. A charge-coupled imaging device as claimed in claim 4, characterized in that the transport of charge packages between said corresponding picture element and one of the preceding and following picture element takes place between two line times.

6. A camera provided with a charge-coupled imaging device as claimed in claim 1.

* * * * *